United States Patent [19]

Yamaji

[11] Patent Number: 5,463,350
[45] Date of Patent: Oct. 31, 1995

[54] BIASING CIRCUIT OF AN AMPLIFIER

[75] Inventor: Hirotaka Yamaji, Tokyo, Japan

[73] Assignee: NEC Corporation, Japan

[21] Appl. No.: 356,488

[22] Filed: Dec. 15, 1994

[30] Foreign Application Priority Data

Dec. 24, 1993 [JP] Japan .................. 5-326790

[51] Int. Cl.$^6$ .................................. H03F 3/04
[52] U.S. Cl. ........................... 330/296; 330/299
[58] Field of Search ......................... 330/261, 267, 330/273, 296, 299

[56] References Cited

U.S. PATENT DOCUMENTS 3,501,710  3/1970  Liepins et al. .................. 330/296

OTHER PUBLICATIONS

Provisional Publication No. 87237/82 of a Japanese patent application entitled "A nonlinear A/D", May 1982.

Primary Examiner—James B. Mullins
Attorney, Agent, or Firm—Laff, Whitesel, Conte & Saret, Ltd.

[57] ABSTRACT

A biasing voltage is supplied from the emitter of an emitter follower npn transistor. The base current of the npn transistor is supplied from the emitter of an emitter follower pnp transistor. Thus, a constant biasing voltage which is not influenced by an average value of an input signal, is supplied to an amplifier.

3 Claims, 2 Drawing Sheets

F I G. 1
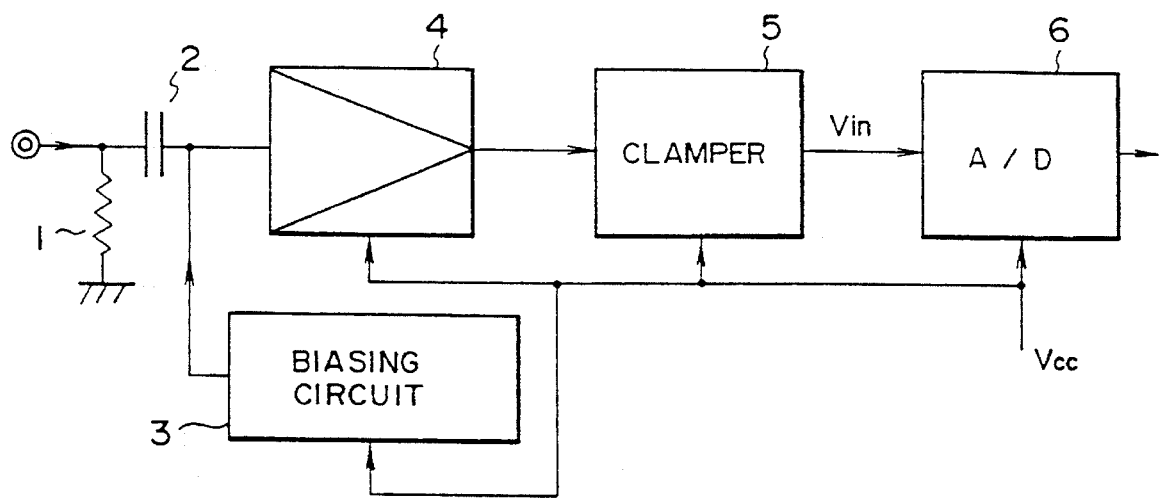
F I G. 2
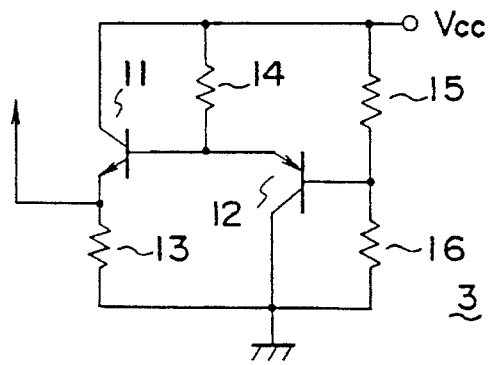
F I G. 3
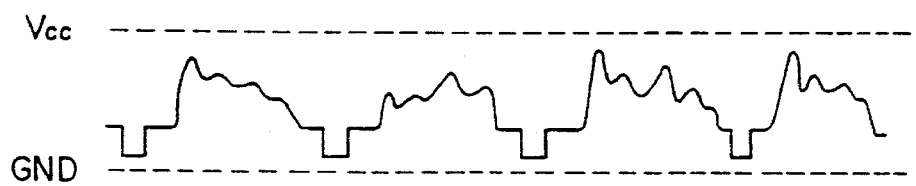

BIASING CIRCUIT OF AN AMPLIFIER

BACKGROUND OF THE INVENTION

This invention relates to a circuit for processing an analog signal before analog to digital conversion, and more particularly to a biasing circuit of an amplifier.

An analog signal must be amplified, before analog to digital conversion, to a level appropriate for a reference voltage of the conversion. And a peak or a bottom of the analog signal is often clamped at a certain voltage level by a clamper. For example, when a television signal as shown in FIG. 3 is to be digitized, bottoms of horizontal synchronizing pulses must be clamped at a certain voltage level, and positive peaks of the amplified signal must be lower than Vcc, where Vcc is a voltage at a positive terminal of power supply to the amplifier, and negative peaks of the signal must be higher than GND(ground), where GND is a voltage at a negative terminal of the power supply to the amplifier.

A nonlinear A/D(analog to digital converter) was proposed on a Provisional Publication No. 87237/82 of a Japanese patent application entitled "A nonlinear A/D". FIG. 4 shows a block diagram of the nonlinear A/D, wherein a reference voltage Vrf for analog to digital conversion is not a constant voltage, but a voltage synthesized from a constant bias voltage Vbias and a mean value of an input signal Vin(mean), and can be expressed by Vrf=$\alpha$ Vin(mean)+Vbias. Thus, an accommodation between mean value of the signal voltage and the reference voltage is automatically obtained, and a variety of nonlinear characteristic is obtained by varying the coefficient $\alpha$.

But, clipping of peaks and bottoms can not be avoided by the nonlinear A/D. Referring to FIG. 4, an analog signal is terminated by a termination resister 1, and DC component of the analog signal is cut by a capacitor 2. The other electrode of the capacitor 2 is grounded through an input resistor(not shown in the drawing) of an amplifier 4. A biasing voltage is automatically generated by a mean value of current flowing in the input resistor. This automatic biasing can not prevent the clipping.

A low pass filter 8 produces a mean value Vin(mean) of the input signal, and this mean value is synthesized at a voltage synthesizer 9 to produce the reference voltage Vrf.

As shown by FIG. 5, when a mean value of the signal is low, a low biasing voltage is generated, and if a bottom of the signal comes at the low biasing, the bottom of the signal may be clipped, and when a mean value of the signal is high, a high biasing voltage is generated, and if a peak of the signal comes at the high biasing, the peak of the signal may be clipped. When the clipped bottom of the signal is a horizontal synchronizing pulse, the pulse is lost, and when the clipped peak of the signal is in a video signal, the waveform of the video signal is distorted.

SUMMARY OF THE INVENTION

Therefore, a primary object of the present invention is to provide a biasing circuit for producing a bias voltage which is exactly at a center between the positive and the negative terminals of the power supply to the amplifier.

The object can be achieved by supplying the biasing voltage through an emitter follower of an npn transistor. The base current of the npn transistor is supplied from an emitter of an emitter follower of a pnp transistor.

BRIEF DESCRIPTION OF THE DRAWINGS

Further objects, features, and advantages of this invention will become apparent from a consideration of the following description, the appended claims, and the accompanying drawings in which the same numerals indicate the same or the corresponding parts.

FIG. 1 shows a block diagram of an embodiment of this invention.

FIG. 2 shows a circuit diagram of a biasing circuit in FIG. 1.

FIG. 3 shows a waveform of an analog signal to be digitized.

DETAILED DESCRIPTION OF THE PREFERRED EMBODIMENTS

Figure 4:
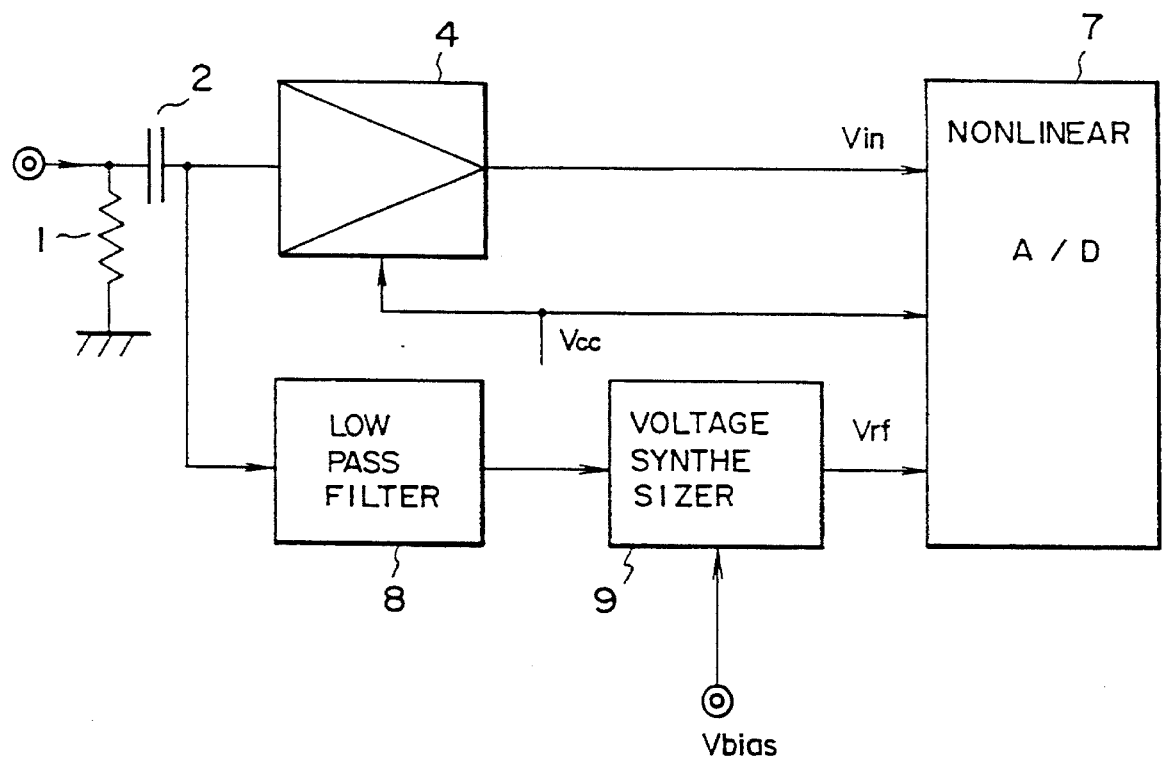
FIG. 4 shows a block diagram of a prior art.
Figure 5:
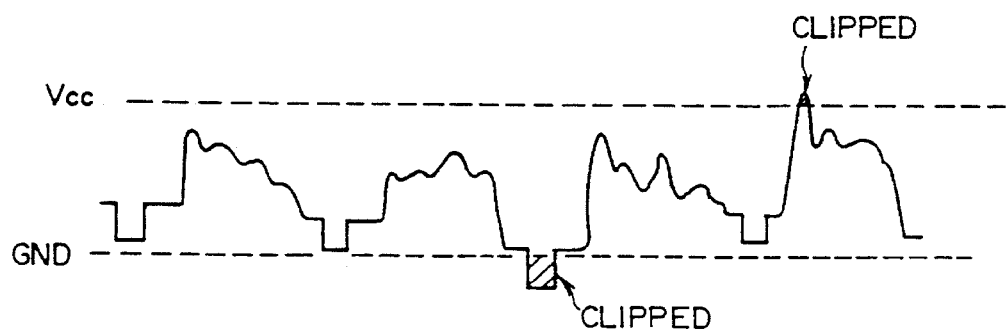
FIG. 5 shows a dipping in an amplifier of a prior art.

Referring to FIG. 1, a biasing circuit 3 is connected at an input terminal of the amplifier 4, and a clamper 5 is connected after the amplifier 4. Vin denotes an analog signal input to an A/D 6. Vcc denotes a voltage at a positive terminal of a power supply supplied to the biasing circuit 3, the amplifier 4, the clamper 5. In the A/D 6, Vcc is used as the reference voltage Vrf for analog to digital conversion. The negative terminal of the power supply is grounded (V=0) in this embodiment. But in a general case, the negative terminal of the power supply may be at V=–Vd.

Now, referring to FIG. 2, an npn transistor 11 is connected as an emitter follower between Vcc and GND(ground)(in a generalized expression –Vd). The emitter of the transistor 11 is connected to GND through a resistor 13. The base current of the transistor 11 is supplied from the emitter of a pnp transistor 12 which is connected as an emitter follower between Vcc and GND. The emitter of the transistor 12 is connected to Vcc through a resistor 14.

Resistors 15 and 16 compose a voltage divider for generating a voltage $\alpha$Vcc(in general, $\alpha$(Vcc+Vd)–Vd). This voltage supplies the base current of the transistor 12, and the voltage at the base of the transistor 11 becomes $\alpha$Vcc+Vebp where Vebp is a voltage drop between the emitter and the base of the pnp transistor 12. Therefore, the voltage at the emitter of the transistor 11 is represented by $\alpha$Vcc+Vebp–Vben where Vben is a voltage drop between the base and the emitter of the npn transistor 11. When Vebp=Vben, the biasing voltage which is delivered from the emitter of the transistor 11 becomes $\alpha$vcc. The coefficient a is determined by the voltage divider circuit. When the two resistors 15 and 16 have a same resistance value, $\alpha$ is 0.5, and 0.5 Vcc is the center of Vcc and GND as shown in FIG. 3. When an average value of input signal changes, an average voltage at the termination resister 1(an average voltage on the electrode of the capacitor 2 connected to the resistor 1)changes, but the average voltage on the other electrode of the capacitor 2 connected to the biasing circuit 3 is maintained at a voltage 0.5 Vcc.

When the biasing voltage is maintained at the center of the power supply voltage, it is apparent that there is a least chance of voltage clipping in the amplifier 4.

FIG. 3 shows a waveform of a television signal amplified by the amplifier 4 of this invention. The bottoms of the horizontal synchronizing pulses in FIG. 3 are clamped at a predetermined voltage level in the clamper 5.

Heretofore, this invention is described in connection with an amplifier of a television signal which is to be digitized, but it is apparent that this invention can be applied to an amplifier for analog signal in general.

What is claimed is:

1. A biasing circuit of an amplifier comprising:

a voltage divider for generating a voltage between a voltage Vcc at the positive terminal of a power supply of said amplifier and a voltage −Vd at the negative terminal of said power supply;

a pnp transistor, with its emitter connected to said voltage Vcc through a resistor, with its collector connected to said voltage −Vd, and with its base current supplied through said voltage divider;

an npn transistor with its collector connected to said voltage Vcc, with its emitter connected to said voltage −Vd through an emitter follower resistor, and with its base current supplied through said emitter of said pnp transistor; and means for supplying a biasing voltage to said amplifier from said emitter of said npn transistor.

2. A biasing circuit of an amplifier of claim 1, wherein said voltage −Vd=0.

3. A biasing circuit of an amplifier of claim 2, wherein said voltage divider produces a voltage 0.5 Vcc.

* * * * *